US012142552B2

(12) United States Patent
Fontana (10) Patent No.: US 12,142,552 B2
(45) Date of Patent: Nov. 12, 2024

(54) LEAD FRAME FOR A PACKAGE FOR A SEMICONDUCTOR DEVICE, SEMICONDUCTOR DEVICE AND PROCESS FOR MANUFACTURING A SEMICONDUCTOR DEVICE

(71) Applicant: STMicroelectronics S.r.l., Agrate Brianza (IT)

(72) Inventor: Fulvio Vittorio Fontana, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/070,051

(22) Filed: Nov. 28, 2022

(65) Prior Publication Data

US 2023/0090848 A1  Mar. 23, 2023

Related U.S. Application Data

(62) Division of application No. 16/940,815, filed on Jul. 28, 2020, now Pat. No. 11,515,240.

(30) Foreign Application Priority Data

Aug. 1, 2019 (IT) .................. 102019000013704

(51) Int. Cl.
*H01L 23/495* (2006.01)
*H01L 23/00* (2006.01)
(Continued)

(52) U.S. Cl.
CPC .. *H01L 23/49586* (2013.01); *H01L 23/49503* (2013.01); *H01L 23/49541* (2013.01);
(Continued)

(58) Field of Classification Search
CPC .......... H01L 23/49503–49513; H01L 23/49579–49586; H01L 23/49541
See application file for complete search history.

(56) References Cited

U.S. PATENT DOCUMENTS 5,695,810 A * 12/1997 Dubin ............... H01L 21/76831
427/443.1
2003/0075792 A1   4/2003 Ruhland
(Continued)

FOREIGN PATENT DOCUMENTS

| EP | 1662565 A2 | 5/2006 |
| JP | H03149865 A | 6/1991 |
| WO | 2007011767 A1 | 1/2007 |

OTHER PUBLICATIONS

IT Search Report and Written Opinion for IT 102019000013704 dated Apr. 20, 2020 (9 pages).
(Continued)

*Primary Examiner* — Laura M Menz
*Assistant Examiner* — Candice Chan
(74) *Attorney, Agent, or Firm* — Crowe & Dunlevy LLC (57) ABSTRACT

A lead frame for an integrated electronic device includes a die pad made of a first metallic material. A top coating layer formed by a second metallic material is arranged on a top surface of the die pad. The second metallic material has an oxidation rate lower than the first metallic material. The top coating layer leaves exposed a number of corner portions of the top surface of the die pad. A subsequent heating operation, for example occurring in connection with wirebonding, causes an oxidized layer to form on the corner portions of the top surface of the die pad at a position in contact with the top coating layer.

15 Claims, 11 Drawing Sheets

(51) Int. Cl.
*H01L 23/31* (2006.01)
*H01L 21/56* (2006.01)
(52) U.S. Cl.
CPC .............. *H01L 24/85* (2013.01); *H01L 21/56* (2013.01); *H01L 23/3107* (2013.01); *H01L 23/49582* (2013.01)

(56) References Cited

U.S. PATENT DOCUMENTS

2016/0035655 A1    2/2016   Howard et al.
2019/0221502 A1    7/2019   Fernandez et al.

OTHER PUBLICATIONS

Extended EPO Search Report for co-pending EP Appl. No. 20189128.0 dated Oct. 19, 2020 (9 pages).

* cited by examiner

LEAD FRAME FOR A PACKAGE FOR A SEMICONDUCTOR DEVICE, SEMICONDUCTOR DEVICE AND PROCESS FOR MANUFACTURING A SEMICONDUCTOR DEVICE

CROSS REFERENCE TO RELATED APPLICATIONS

This application is a divisional of U.S. patent application Ser. No. 16/940,815, filed Jul. 28, 2020, which claims the priority benefit of Italian Application for Patent No. 102019000013704, filed on Aug. 1, 2019, the contents of which are hereby incorporated by reference in their entireties to the maximum extent allowable by law.

TECHNICAL FIELD

The present invention relates to a lead frame for a package for a semiconductor device, as well as to a semiconductor device and to a process for manufacturing a semiconductor device.

BACKGROUND

As is known, semiconductor devices, such as, for example, integrated circuits and MEMS devices, are encapsulated inside corresponding packages which perform functions of protection and interfacing with the outside world. For example, packages are known that enable so-called "surface mounting" on a printed-circuit board.

In greater detail, surface-mount packages include, for example, the so-called packages of a "quad-flat no-leads" (QFN) type, also known as "micro lead frame" (MEF) packages or "small-outline no-leads" (SON) packages.

In general, a QFN package comprises a region of resin, encapsulated or embedded inside which is a metallic lead frame (typically, made up of copper), which in turn forms at least one array of terminals that give out onto a bottom surface of the package.

Figure 1:
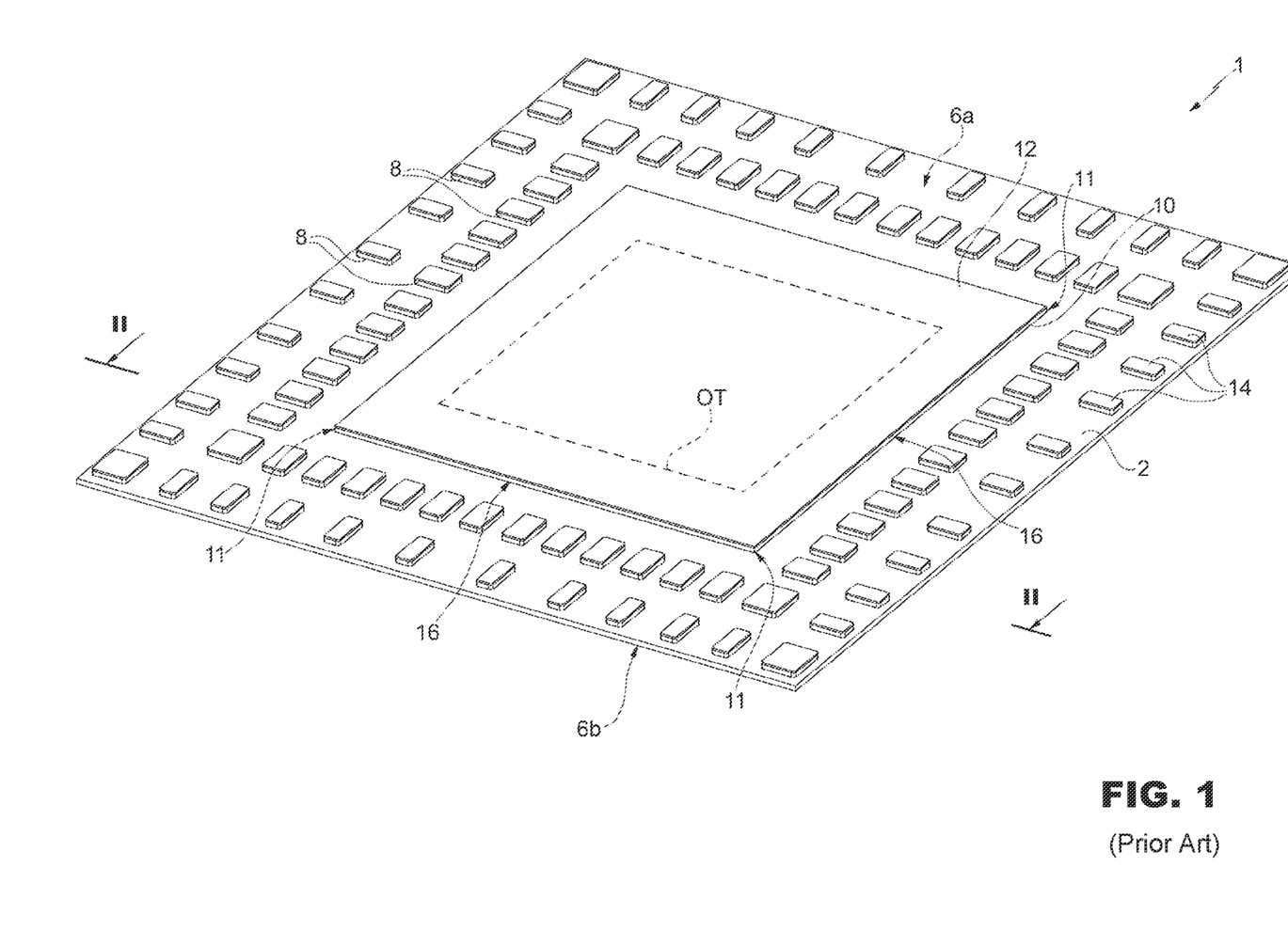
FIG. 1 schematically shows a perspective view of a lead frame.
Figure 2:
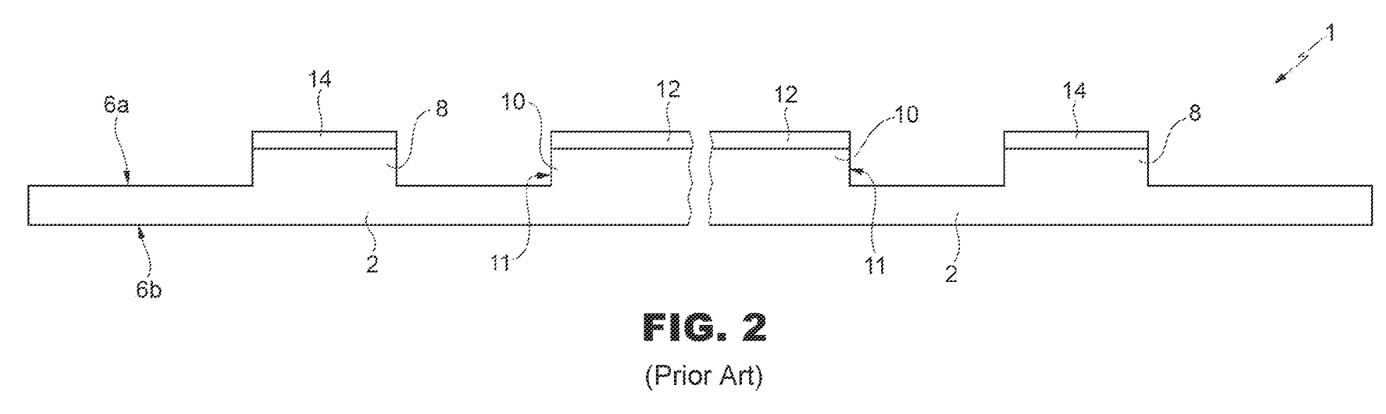
FIG. 2 schematically shows a cross-section of the lead frame shown in FIG. 1, taken along the line II-II shown in FIG. 1.

As shown in FIGS. 1 and 2, a lead frame 1 includes a main body 2, which is planar and has, in top plan view, a polygonal shape (typically, a square or a rectangle); the main body 2 defines a top surface 6a and a bottom surface 6b. A plurality of pads 8 extend upwards from the main body 2, i.e. from the top surface 6a. In addition, the lead frame 1 comprises the so-called die pad 10, which extend upwards from the main body 2 and is surrounded, at distance, by the inner pads 8.

The main body 2, the pads 8 and the die pad 10 form one single piece of metal. In addition, the die pad 10 is planar and has, in top plan view, a polygonal shape (typically, a square or a rectangle). In FIG. 1, the die pad 10 has the shape of a parallelepiped and its lateral walls 16 intersect at four edges 11 (only three visible in FIG. 1).

In addition, the lead frame 1 is plated, usually by means of silver or a metallic alloy (such as NiPdAu). In particular, the lead frame 1 undergoes a plating process (e.g., an electroplating) which allows to form a top coating region 12 on the die pad 10, and a plurality of secondary coating regions 14, each of which is arranged on a corresponding pad 8. As mentioned before, the top coating region 12 and the secondary coating region 14 are formed by silver or a metallic alloy, for example, by a material which is less prone to oxidation (in particular, oxidation in air) than the material forming the lead frame 1 (i.e., by a material having a lower oxidation rate than the lead frame). In addition, the top coating region 12 and the secondary coating region 14 may have a thickness comprised in the range 3-9 µm; the pads 8 and the die pad 10 may have a thickness comprised in the range 3-4 µm.

Traditionally, lead frames are manufactured in strips, which are subsequently used in the manufacturing processes. Furthermore, the manufacturing processes typically comprise a step of back-etching to remove the main body 2 and separate the pads 8 from the die pad 10.

Figure 3:
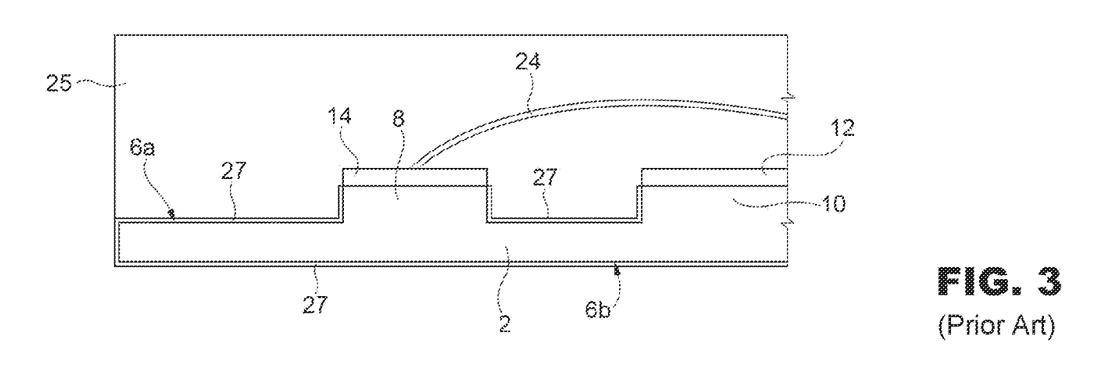
FIG. 3 schematically shows a cross-section of a portion of a packaged device including the lead frame shown in FIGS. 1 and 2.

In addition, the manufacturing processes typically include the steps of setting the die (not shown) on the die pad 10, and then electrically connecting the conductive pads of the die to corresponding pads 8 of the lead frame 1, by means of wire bondings 24, as shown in FIG. 3. In order to set up the wire bondings 24, a thermal treatment is carried out, usually at a temperature of about 200° C., in air, and with a duration of about ten minutes; such a thermal treatment causes a controlled oxidation of the exposed parts of the lead frame 1, i.e. of the parts of the lead frame 1 not coated by the top coating region 12, nor by the secondary coating regions 14. Therefore, after the thermal treatment, an oxidized layer 27 extends on parts of the lead frame 1, as well as under the lead frame 1.

A packaging region 25 is then formed, typically by means of molding, on top of the lead frame 1 and the die. The packaging region 25, also known as "molding compound", may be made of a thermosetting epoxy resin and extends in direct contact with part of the top coating region 12, as well as with the secondary coating regions 14 and with the oxidized layer 27.

Figure 4:
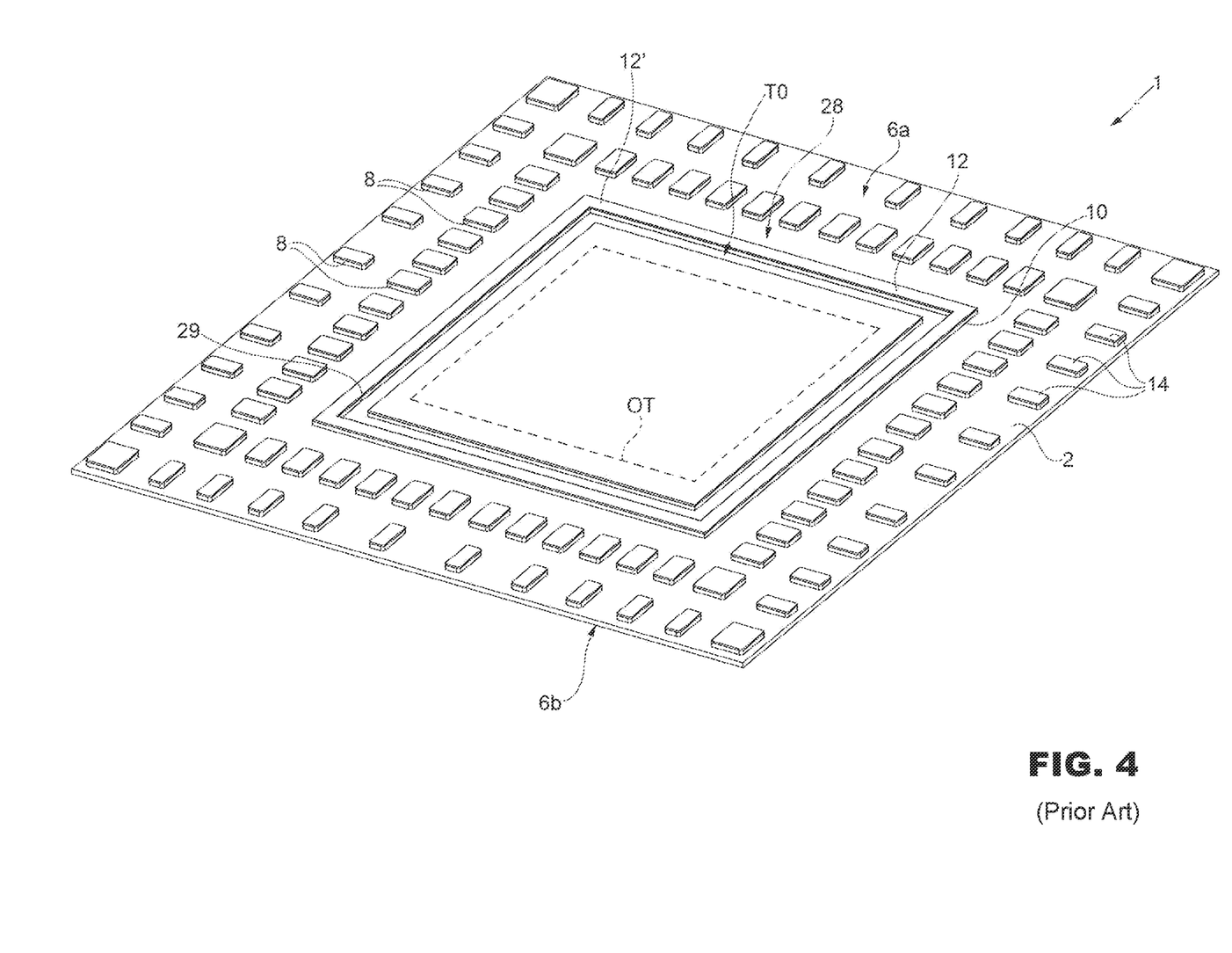
FIG. 4 schematically shows a perspective view of a further lead frame.

According to a different example, shown in FIG. 4, the lead frame 1 may include a die pad structure 28 including the die pad 10, a ground ring 29 which laterally surrounds the die pad 10, and a trench TO extending between the die pad 10 and the ground ring 29, so as to expose a corresponding portion of the underlying main body 2. The ground ring 29 extends upwards from the main body 2, has the same thickness as the die pad 10 and has the shape of a squared frame; the ground ring 29 forms a single piece with the main body 2, the die pad 10 and the pads 8 The pads 8 surround the die pad structure 28. In addition, the ground ring 29 is coated, at top, by an additional coating region 12', which is made of the same material as the top coating region 12 and has the same thickness as this latter.

FIG. 1 and FIG. 4 each show, in dashed line the projection of the outline OT, a possible die on the top coating region 12.

This having been said, the difference between the coefficients of thermal expansion (CTE) of the packaging region 25 and the lead frame 1 may cause mechanical stresses, due to temperature changes which occur during the functioning of the electronic device implemented in the die.

In particular, referring as an example to FIGS. 1 and 2, it is noted that mechanical stresses are concentrated at the corners of the die pad 10, where they may induce a local delamination (i.e., the detachment of portions of the top coating region 12 from the packaging region 25), which may then propagate, causing cracks and affecting the device reliability over time, in particular when causing the exposure of the die to the external atmosphere.

In order to solve the problem of the delamination, several solutions have been proposed.

In particular, a first solution envisages the use of additional adhesion promoter materials to be applied on the lead frame surface. Unfortunately, such a solution entails high costs.

A second solution envisages the formation of holding structures (such as grooves or dimples) in the lead frame.

However, such a solution, besides entailing a reduction of the available packaging space, has proved to be not effective in case of large packaging formats, where higher stresses occur.

Finally, a third solution has been proposed, which envisages the use of a so-called rough lead frame, i.e., a lead frame which has undergone a chemical or mechanical process to render its surfaces rough. Unfortunately, this solution also entails high costs; furthermore, it negatively affects the die attach glue control, due to increase of substrate wettability, and the reliability of the wire bondings.

There is a need in the art to provide a lead frame for a semiconductor device that will solve at least in part the foregoing drawbacks.

SUMMARY

According to the present invention, a lead frame for a semiconductor device, a semiconductor device and a process for manufacturing a semiconductor device are provided.

In an embodiment, a lead frame for an integrated electronic device comprises: a die pad structure of a first metallic material, including a die pad and delimited by a top structure surface; and a top coating structure formed by a second metallic material and arranged on the top structure surface, the second material having an oxidation rate lower than the first material; wherein the top coating structure leaves exposed a number of corner portions of the top structure surface.

In an embodiment, an integrated electronic device comprises: a lead frame as described above; a number of oxidized regions, each of which coats a corresponding corner portion of the top structure surface and laterally contacts the top coating structure; a die, arranged on top of the die pad; and a dielectric packaging region, which covers, in direct contact, the die, the oxidized regions and parts of the top coating structure adjacent to the oxidized regions.

In an embodiment, a method for manufacturing an integrated electronic device comprises: fixing a die to a lead frame as described above; setting up wire bondings between the die and the lead frame, said setting up wire bonding comprising carrying out a thermal treatment which causes the formation of a number of oxidized regions, each of which coats a corresponding corner portion of the top structure surface and laterally contacts the top coating structure; and then forming a dielectric packaging region so that it covers, in direct contact, the die, the oxidized regions and parts of the top coating structure adjacent to the oxidized regions.

BRIEF DESCRIPTION OF THE DRAWINGS

For a better understanding of the present invention, preferred embodiments thereof are now described, purely by way of non-limiting example and with reference to the attached drawings, wherein.

DETAILED DESCRIPTION

The present lead frame stems from the idea of leaving exposed the corners of the die pad structure, so as to create sacrificial oxidized regions which allow to limit the delamination, as described here below, with reference to a lead frame of the type shown in FIG. 1, without this implying any limitation. Therefore, the following description will limit to the differences over the lead frame 1 shown in FIG. 1; in addition, the same reference signs will be used, unless stated otherwise.

Figure 5:
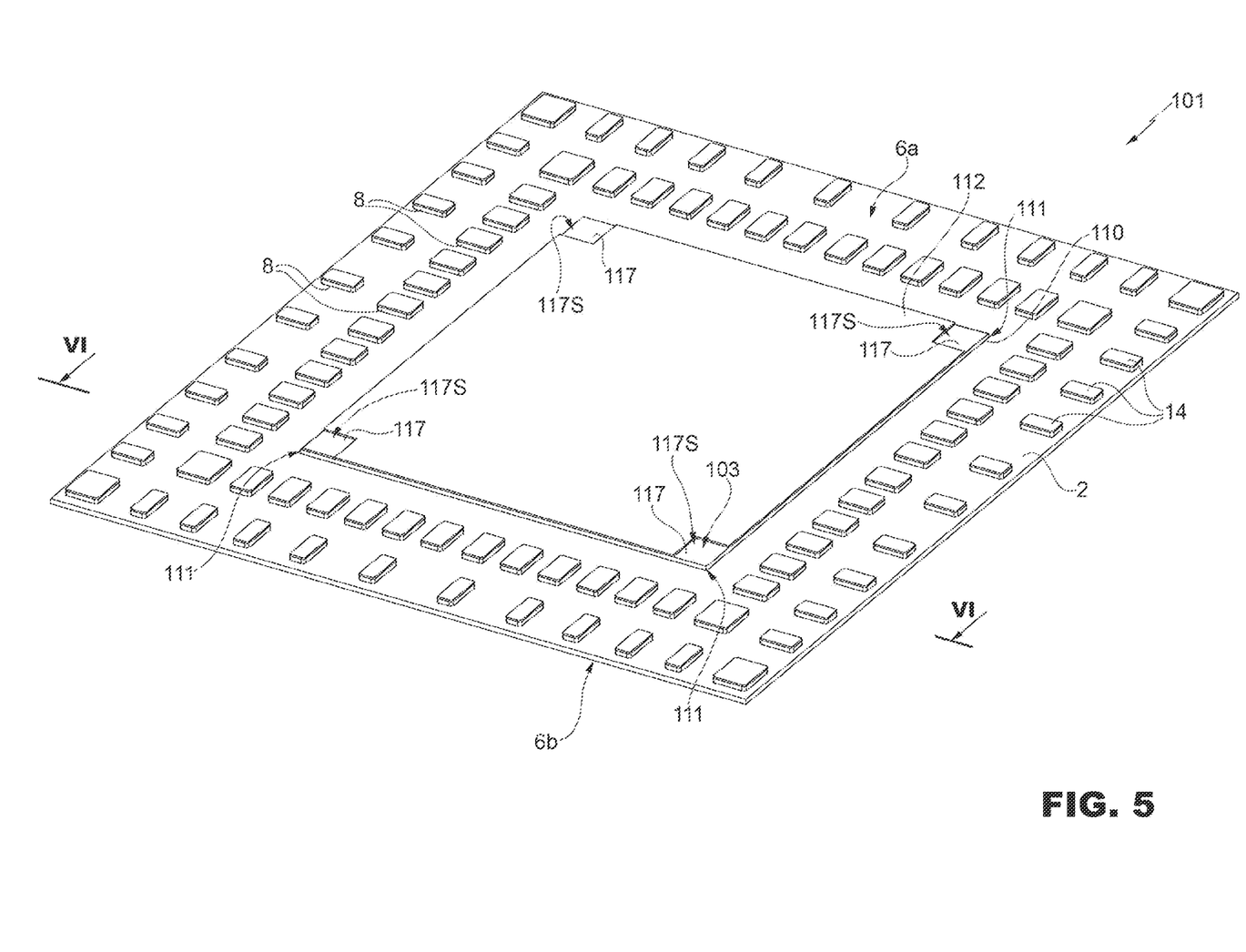
FIG. 5 schematically shows a perspective view of the present lead frame.
Figure 6:
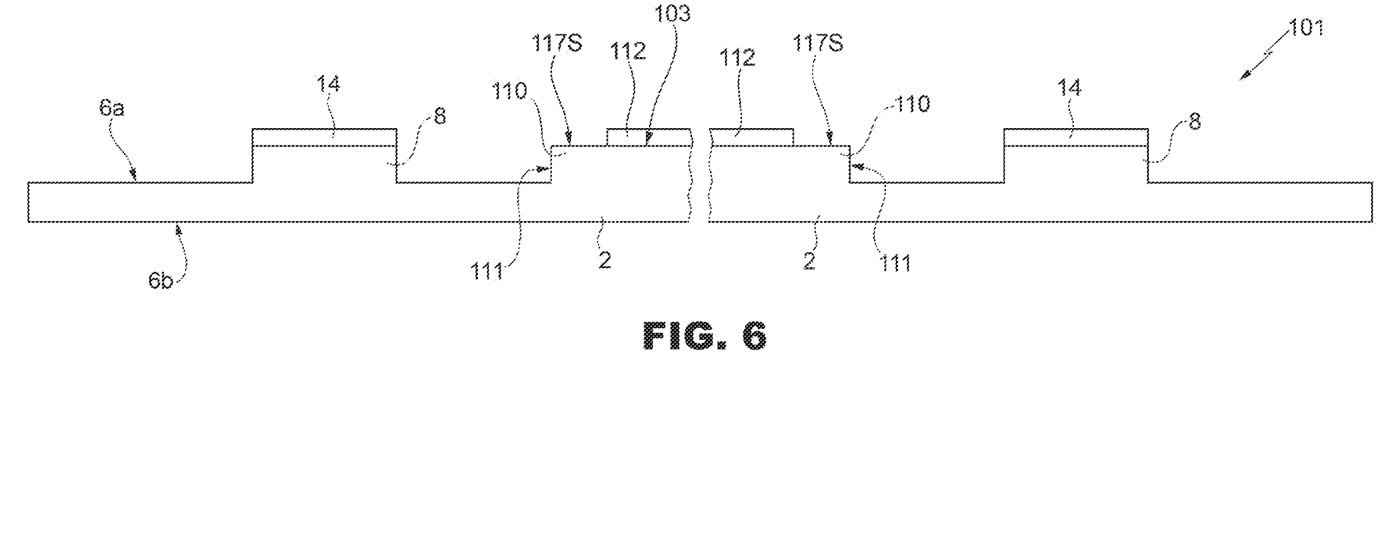
FIG. 6 schematically shows a cross-section of the lead frame shown in FIG. 5, taken along the line VI-VI shown in FIG. 5.

In detail, FIGS. 5 and 6 show a lead frame (here designated by 101), in which the die pad (here designated by 110) has the same shape as the die pad 10 of FIGS. 1 and 2. In addition, the die pad 110 is delimited at top by a front surface 103. The top coating region (here designated by 112) extends on the front surface 103.

In greater detail, the top coating region 112 leaves exposed four corner portions 117 of the die pad 110, which are delimited at top by corresponding portions of the top surface 103, hereinafter referred to as the top angular surface portions 117S.

In particular, each corner portion 117 includes a corresponding edge (here designated by 111) where two adjacent sides of the die pad 110 intersect, perpendicular to the front surface 103 and in contact with this latter. In addition, without this implying any limitation, the four corner portions 117 have one and the same shape; in particular, in top plan view, the corner portions 117 have the shape of a square. Each top angular surface portion 117S extends from a corresponding edge 111 and is separate from the other top angular surface portions 117S; in top view, each top angular surface portion 117S extends from a corresponding vertex of the polygonal shape defined by the top coating region 112.

Figure 7:
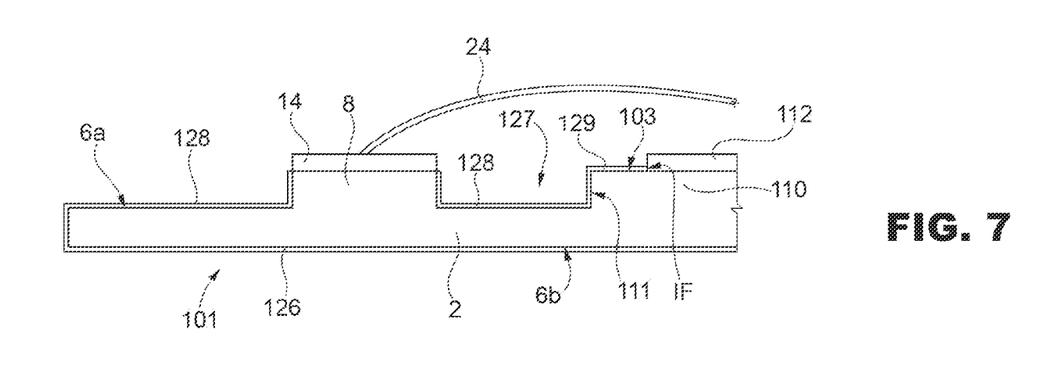
FIG. 7 schematically shows a cross-section of a portion of a packaged device including the lead frame shown in FIGS. 5 and 6, during a step of a manufacturing process.

During the manufacturing process, and in particular during the implementation of the wire bondings, the corresponding thermal treatment leads to the formation of a bottom oxidized layer 126, extending under the bottom surface 6b, and a top oxidized layer 127, as shown in FIG.

7. The bottom oxidized layer 126 and the top oxidized layer 127 may have a thickness comprised, as an example, in the range 100 nm-200 nm.

The top oxidized layer 127 includes a main portion 128, which extends on the top surface 6a of the main body 2, as well as on the side walls of the pads 8 and the die pad 110; therefore, the main portion 128 of the top oxidized layer 127 coats the edges 111 of the die pad 110. In addition, the top oxidized layer 127 comprises four additional portions 129 (only one visible in FIG. 7), hereinafter referred to as the sacrificial portions 129.

In particular, each sacrificial portion 129 extends on a corresponding corner portion 117 of the die pad 110, i.e. on a corresponding top angular surface portion 117S. In addition, each sacrificial portion 129 is laterally staggered with respect to the top coating region 112, with which it is in direct contact, thereby forming a corresponding interface IF.

Referring as an example to a following manufacturing step (shown in FIG. 8) of forming the packaging region 25, such a step, per se known, includes a mold curing at (as an example) 170° C. The packaging region 25 extends, among other things, also on the sacrificial portions 129.

Figure 8:
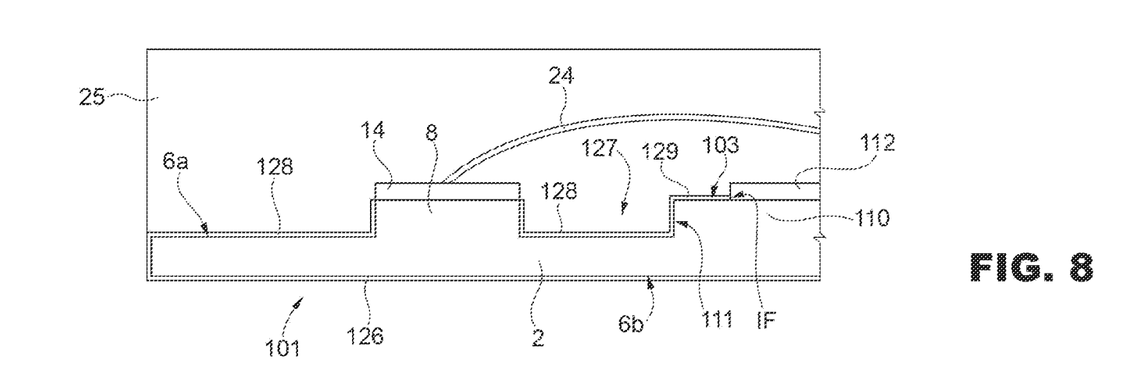
FIG. 8 schematically shows a cross-section of the packaged device shown in FIG. 7, during a following step of the manufacturing process.

The abovementioned curing step causes mechanical stresses due to CTE (coefficient of thermal expansion) mismatch which are unlikely to cause a delamination between the sacrificial portions 129 and the packaging region 25, for the following reasons.

In detail, it is noted that the adhesion between the top oxidized layer 127 and the packaging region 25 is greater than the adhesion between the top oxidized layer 127 and the lead frame 101. In greater detail, at each corner of the die pad 110, the adhesion between the corresponding sacrificial portion 129 and the overlying portion of the packaging region 25 is greater than the adhesion between the sacrificial portion 129 and the underlying corner portion 117 of the die pad 110. Therefore, delamination may occur, at most, between the sacrificial portions 129 and the die pad 110; furthermore, such a delamination does not propagate beyond the interface IF between each sacrificial portion 129 and the top coating region 112, therefore it does not affect the adhesion between the packaging region 25 and the top coating region 112. Therefore, the packaging region 25 and the top coating region 112 continue to encapsulate the die, without exposing this latter to the external atmosphere. The reduced size of the top angular surface portion 117S with respect to the top coating region 112 contributes to achieving this result.

Figure 9:
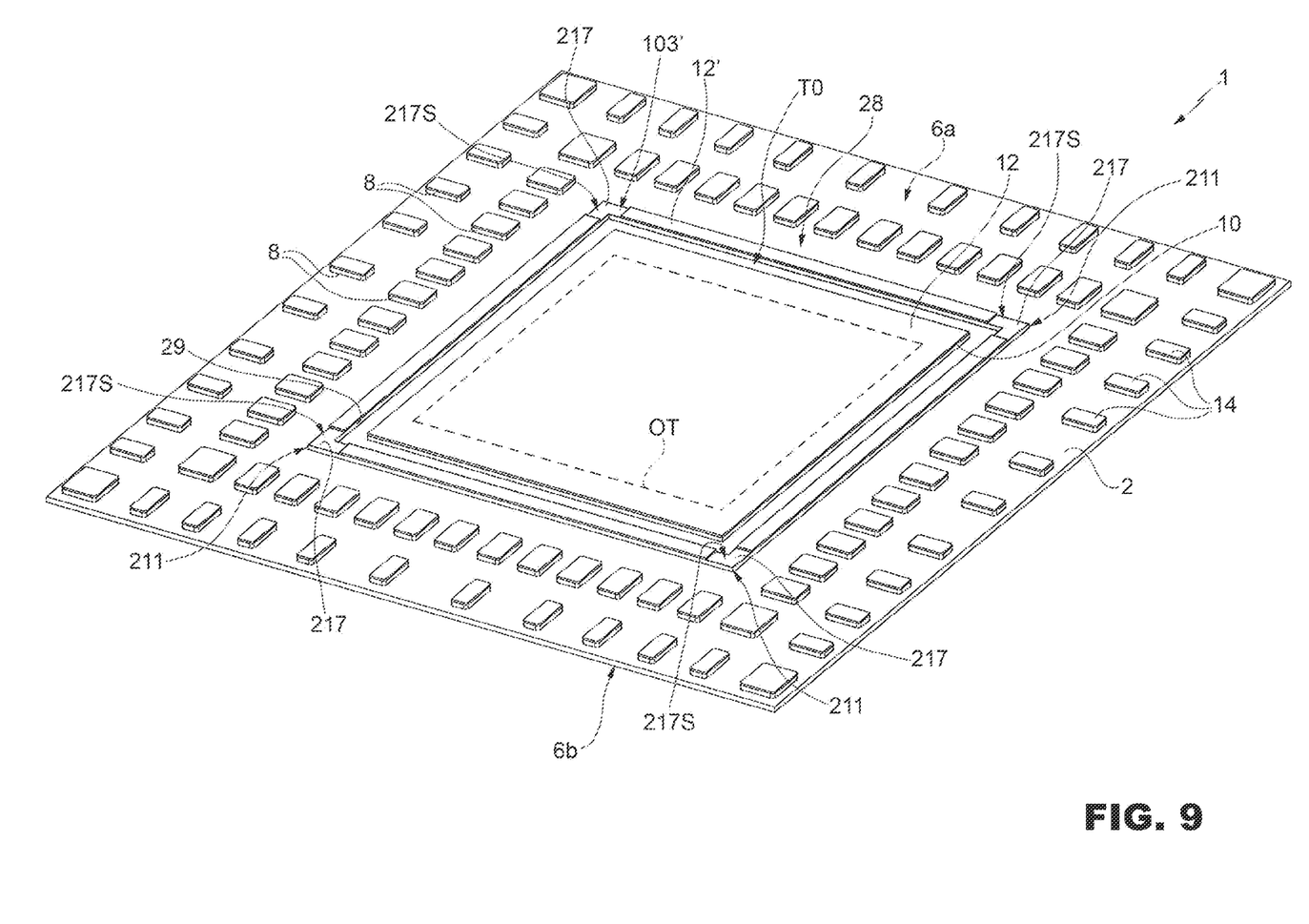
FIG. 9 schematically shows a perspective view of a variant of the present lead frame.

FIG. 9 shows a further embodiment, which will be described hereinbelow with reference to the differences over the lead frame shown in FIG. 4.

In detail, referring to the additional front surface 103' to indicate the front surface of the ground ring 29, the additional coating region 12' leaves exposed four corner portions 217 of the ground ring 29, which are delimited at top by corresponding portions of the additional front surface 103, hereinafter referred to as the additional top angular surface portions 217S.

In particular, the corner portions 217 of the ground ring 29 include, each, a corresponding edge 211 of the lateral outer surface of the square frame forming the ground ring 29. Furthermore, in top plan view, each top angular surface portion 217S has the shape of an "L".

During the manufacturing process, each additional top angular surface portions 217S gets coated by a corresponding oxidized sacrificial region (not shown). Therefore, the embodiment shown in FIG. 9 guarantees the same advantages as the one shown in FIGS. 6-8.

Figure 10:
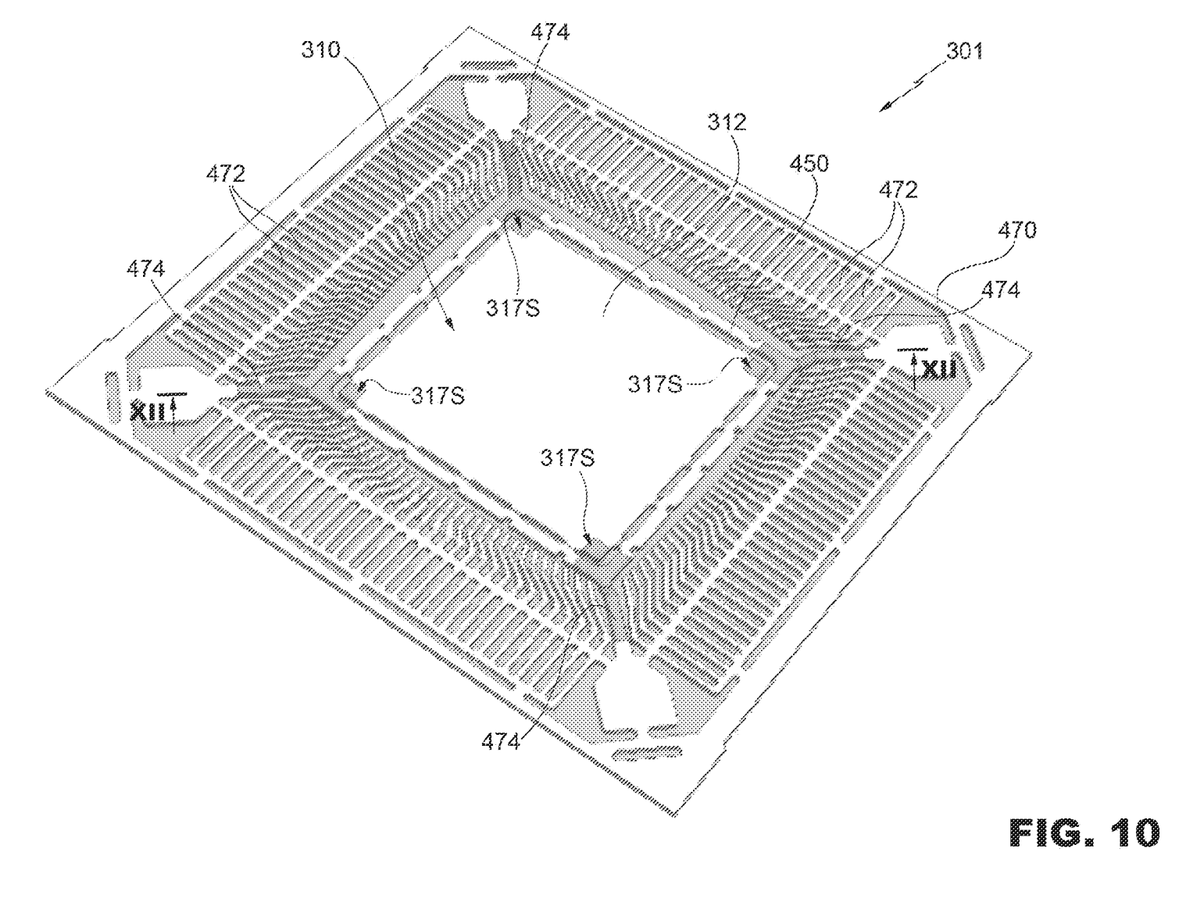
FIG. 10 schematically shows a perspective view of a further variant of the present lead frame.
Figure 11:
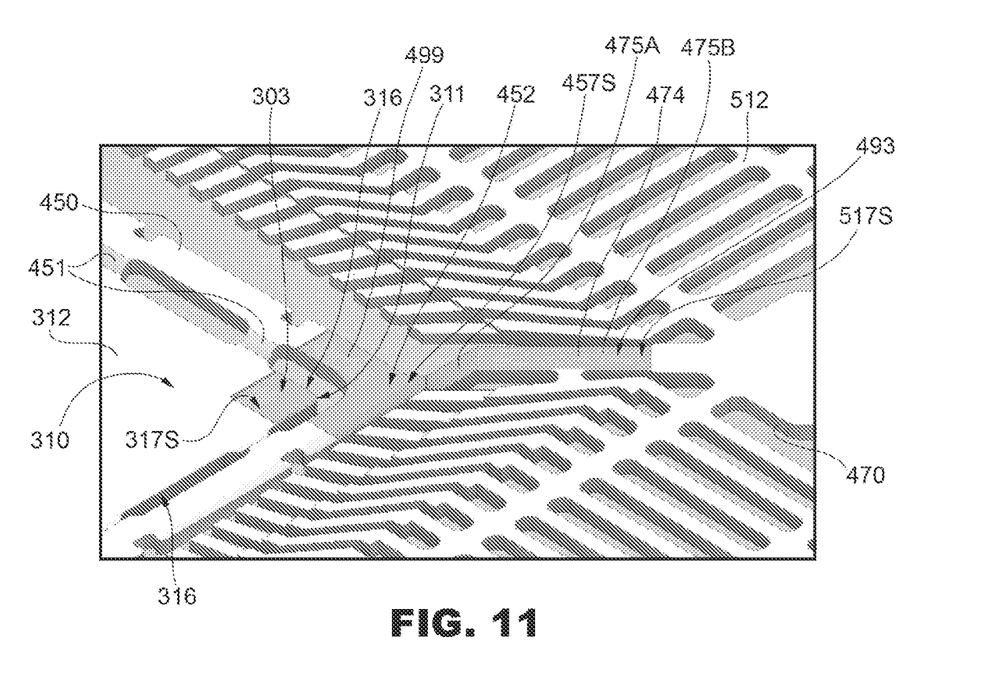
FIG. 11 schematically shows an enlarged perspective view of a portion of the lead frame shown in FIG. 10.
Figure 12:
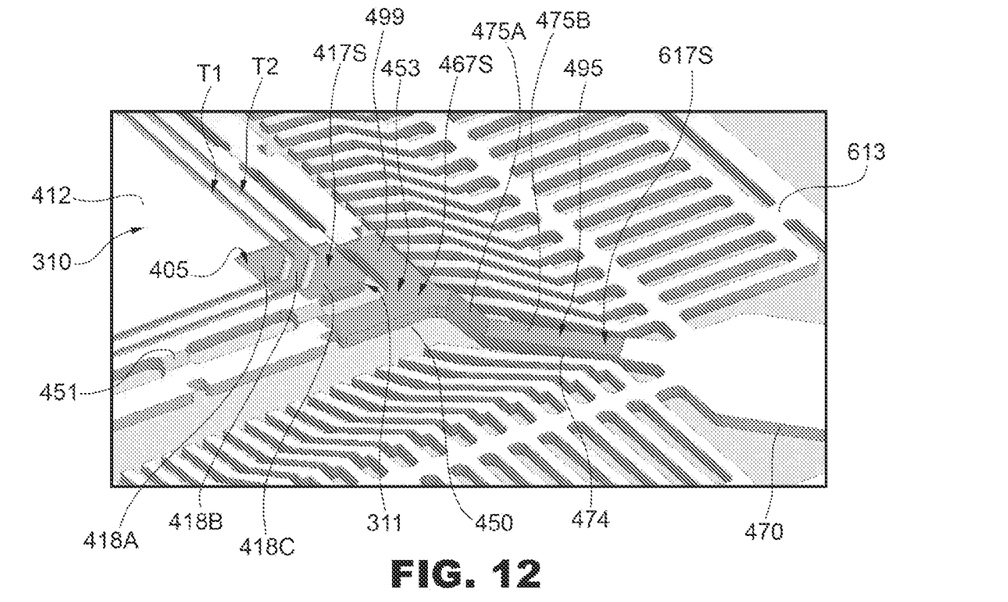
FIG. 12 schematically shows an enlarged perspective view, taken from bottom, of a portion of the lead frame shown in FIGS. 10 and 11.

FIGS. 10-12 show a further embodiment, in which the lead frame, here designated by 301, is suitable to form a package of the so-called thin quad flat pack (TQFP) type.

In this case, the lead frame 301 includes a die pad 310 with a squared planar shape, delimited at top and at bottom, respectively, by the front surface, here designated by 303 (visible in FIG. 11), and by a rear surface 405. The top coating region, here designated by 312, leaves exposed the four top angular surface portions, here designated by 317S. Without this implying any limitation, the edges (here designated by 311) of the die pad 310 are beveled. Each edge 311 is still formed by a corresponding pair of adjacent side walls (here designated by 316) of the die pad 310.

In addition, the rear surface 405 is coated by a bottom coating region 412, which is formed by the same material as the top coating region 312 (as an example, silver) and leaves exposed four corner portions 417S of the rear surface 405, hereinafter referred to as the bottom angular surface portions 417S.

Without this implying any limitation, a pair of (optional) trenches with concentric squared annular shapes may be present. In particular, a first and a second trench T1, T2 may extend through the bottom coating region 412 and part of the die pad 310, with a rectangular cross-section. In greater detail, the second trench T2 surrounds, at distance, the first trench T1; furthermore, the first and second trenches T1, T2 do not completely cross the die pad 310 (i.e., they are blind) and extend in such a way that, as shown in FIG. 12, each bottom angular surface portion 417S is divided into a first, a second and a third exposed subportion 418A, 418B, 418C, the first trench T1 extending, in bottom view, between the first and the second exposed subportions 418A, 418B, the second trench T2 extending between the second and the third exposed subportions 418B, 418C. Therefore, the first exposed subportion 418A is arranged inwardly, whereas the third exposed subportion 418C is arranged outwardly, towards the corresponding edge 311; the second exposed subportion 418B is interposed between the first and the third exposed subportions 418A, 418C.

In addition, the lead frame 310 comprises an inner frame 450 which is squared and planar and surrounds, at distance, the die pad 310, to which it is connected by means of a plurality of bridges 451. In particular, the die pad 310, the bridges 451 and the inner frame 450 form one single piece of metal (i.e., they are made up of one and the same material); in addition, the inner frame 450 may be vertically staggered with respect to the die pad 310, i.e. it may be arranged at an height (measured in a direction perpendicular to the die pad 310) higher than the die pad 310. In addition, the inner frame 450 is delimited at top and at bottom by, respectively, a top frame surface 452 and a bottom frame surface 453.

The top coating region 312 extends also on the front surfaces of the bridges 451, as well as on the top frame surface 452, leaving exposed four angular portions 457S of this latter, hereinafter referred to as the top frame surface portions 457S. In top plan view, each top frame surface portions 457S has the shape of an "L", whose concavity houses part of the corresponding top angular surface portion 317S.

In addition, the bottom coating region 412 extends also on the rear surfaces of the bridges 451, as well as on the bottom frame surface 453, leaving exposed four angular portions 467S of this latter, hereinafter referred to as the bottom frame surface portions 467S. In bottom view, each bottom frame surface portion 467S has the shape of an "L", whose concavity houses the corresponding third exposed subportion 418C. Each bottom frame surface portion 467S and the corresponding top frame surface portion 457S delimit, respectively at top and at bottom, a corresponding corner portion 499 of the inner frame 450.

The lead frame 301 further comprises an outer frame 470, which is planar and squared and surrounds, at distance, the inner frame 450, and a plurality of cantilever leads 472, each cantilever lead 472 being fixed to the outer frame 470 and extending towards the inner frame 450. Without this implying any limitation, the outer frame 470 may be vertically staggered with respect to the inner frame 450, and in particular it may be arranged at an height higher than the inner frame 450. In this case, the die pad 310, the inner frame 450 and the outer frame 470 lie in corresponding planes which, though arranged at different heights, are parallel.

In addition, the lead frame 301 comprises four connecting elements 474, hereinafter referred to as tie bars 474. Each tie bar 474 has an elongated shape and two ends, a first end being fixed to the inner frame 450, the second end being fixed to the outer frame 470. The die pad 310, the inner frame 450, the outer frame 470, the cantilever leads 472 and the tie bars 474 form a single metallic piece.

Each tie bar 474 is delimited at top and at bottom by, respectively, a respective top surface 493 and a respective bottom surface 495. Furthermore, each tie bar 474 comprises a slanted portion 475A and a planar portion 475B. The planar portion 475B connects to the outer frame 470. The slanted portion 475A is interposed between the inner frame 450 and the planar portion 475B; in particular, the slanted portion 475A connects to a corresponding corner portion 499 of the inner frame 450. In addition, either the top surface 493 and the bottom surface 495 have the shape of a pair of plane surfaces connected to one another (i.e, one slanted plane surface and an horizontal plane surface, connected to one another).

In addition, the upper sides of the cantilever leads 472 and of the outer frame 470 are coated by an outer top coating region 512; the lower sides of the cantilever leads 472 and of the outer frame 470 are coated by an outer bottom coating region 613. The outer top coating region 512 and the outer bottom coating region 613 may be formed by the same metallic material as the top coating region 312 and the bottom coating region 412.

The outer top coating region 512 leaves exposed a portion 517S of the top surface 493 of each tie bar 474, hereinafter referred to as the exposed top elongated surface 517S. Each exposed top elongated surface 517S connects to a corresponding top frame surface portion 457S.

The outer bottom coating region 613 leaves exposed a portion 617S of the bottom surface 493 of each tie bar 474, hereinafter referred to as the exposed bottom elongated surface 617S. Each exposed bottom elongated surface 617S connects to a corresponding bottom frame surface portion 467S.

Figure 13:
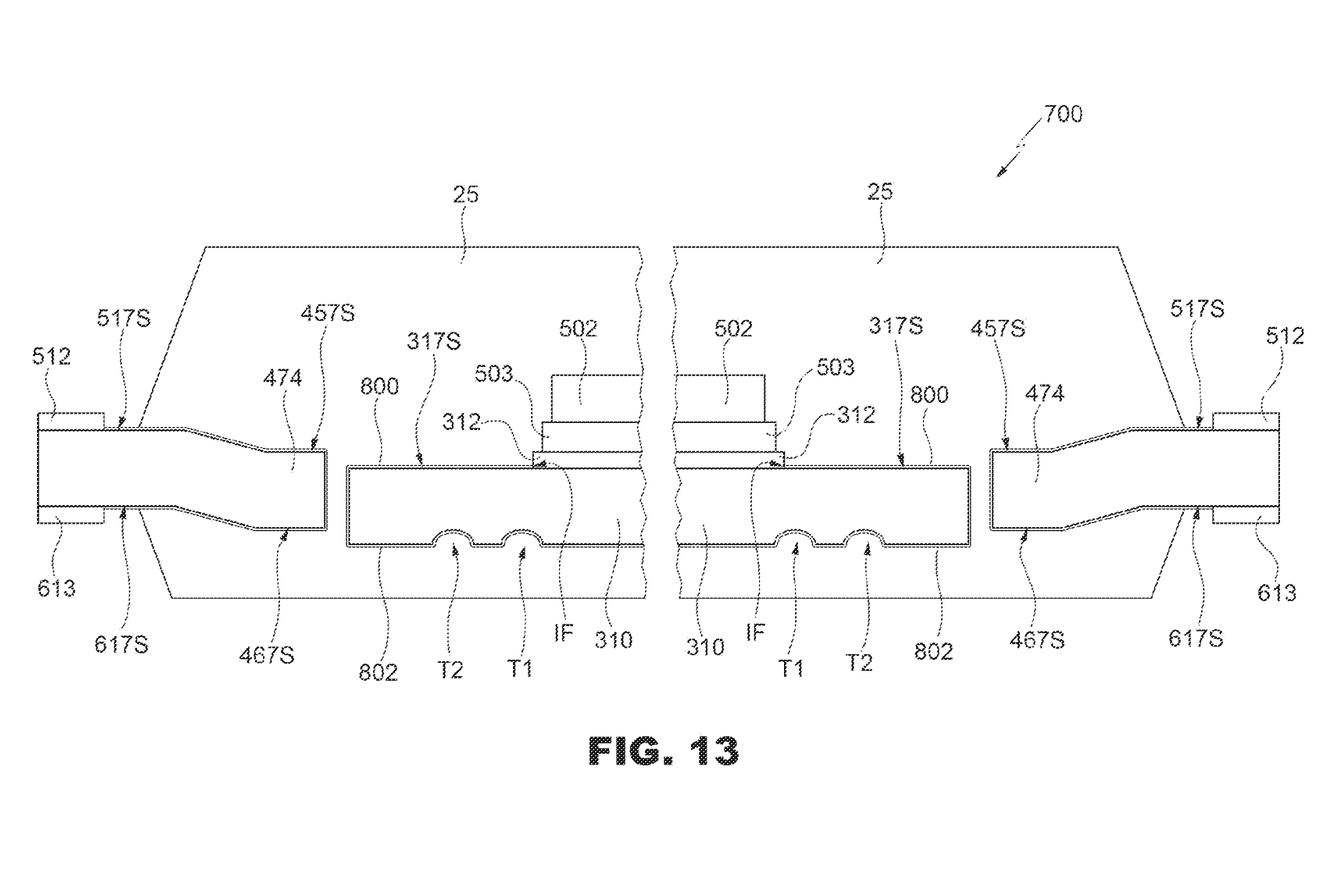
FIG. 13 schematically shows a cross-section of a packaged device including the lead frame shown in FIGS. 10-12, in a normal operative condition.

As shown in FIG. 13, the lead frame 301 may be used to manufacture an integrated electronic device 700, which includes a die 502, fixed on a portion of the top coating region 312 covering the die pad 310, by means of an interposed layer 503 of epoxy conductive glue, silver filled. The packaging region 25 englobes the lead frame 301, which has previously undergone a cutting process which, in a per se know manner, led to the removal of the outer frame 470, as well as of parts of the cantilever leads 472 and of the tie bars 474 connected thereto.

The packaging region 25 leaves exposed the bottom coating region 412 and part of each tie bar 474. In particular, for each tie bar 474, outer parts of the exposed top elongated surface 517S and of the exposed bottom elongated surface 617S extend outside the packaging region 25; inner parts of the exposed top elongated surface 517S and of the exposed bottom elongated surface 617S extend inside the packaging region 25.

In addition, parts of the tie bar 474 covered, on opposite sides, by the outer top coating region 512 and the outer bottom coating region 613 extend outside the packaging region 25.

As previously explained, the exposed parts of the lead frame 301 are covered by a metal oxide layer. In particular, each exposed top elongated surface 517S and the corresponding top frame surface portion 457S are coated by a corresponding top oxidized region 800; each exposed bottom elongated surface 617S and the corresponding bottom frame surface portion 467S are coated by a bottom oxidized region 802, forming one single oxidized region with the top oxidized region 800.

Figure 14:
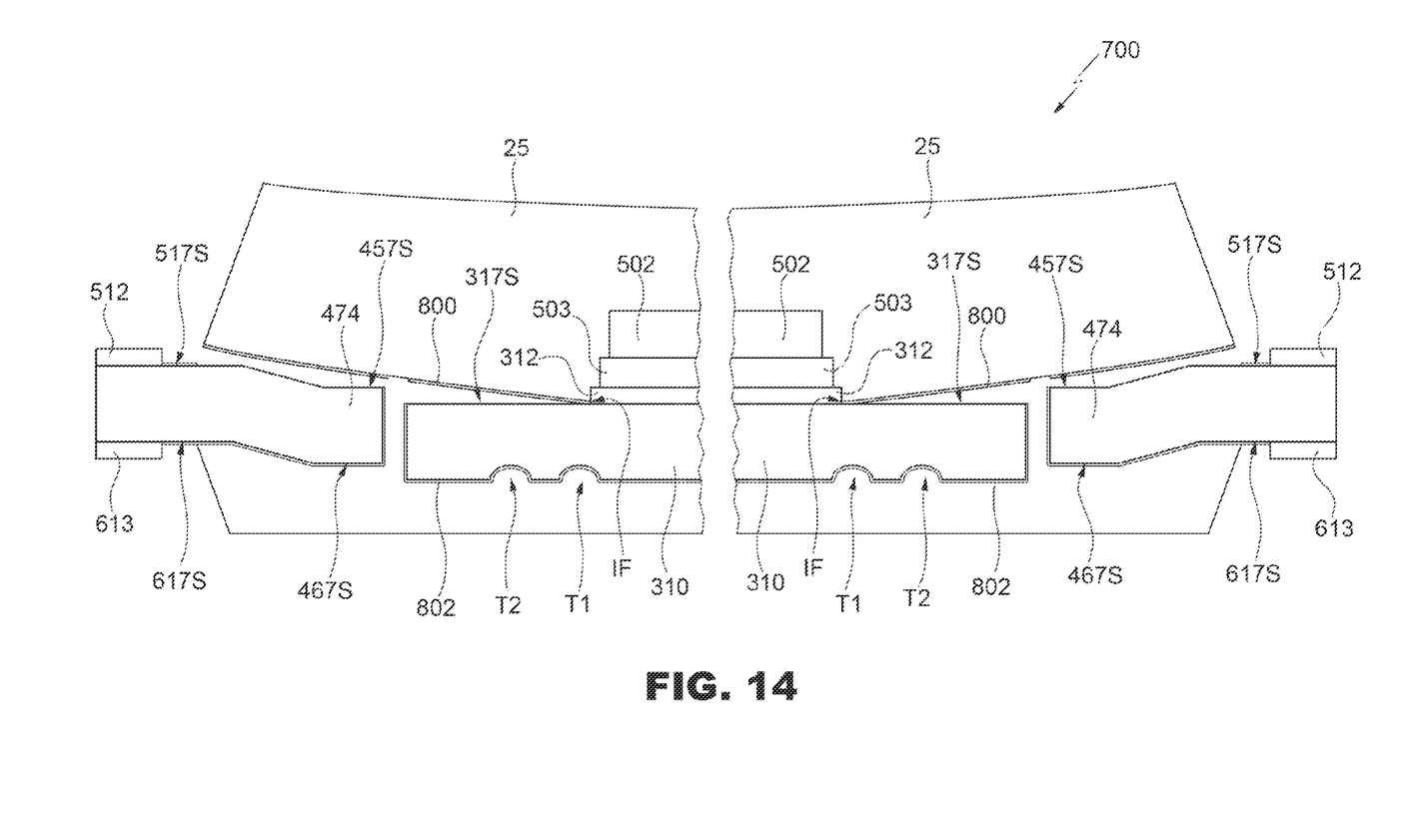
FIG. 14 schematically shows a cross-section of the packaged device shown in FIG. 13, when delamination occurs.

It is noted that delamination is more likely to occur between the top/bottom oxidized region 800/802 and the lead frame 301, than between the top/bottom oxidized region 800/802 and the packaging region 25. As an example, FIG. 14 shows a delamination occurring between the top oxidized region 800 and the lead frame 301 and propagating only up to the interface (still designated by IF) between the top oxidized region 800 and the top coating region 312, without affecting the adhesion between the top coating region 312 and the die pad 310.

In greater detail, the interface IF between the top oxidized region 800 and the part of the top coating region 312 adjacent (i.e., in direct contact) to the top oxidized region 800 is overlaid by the packaging region 25 and acts as stop point to the propagation of a delamination between the top oxidized region 800 and the lead frame 301. Therefore, such a delamination does not cause, as an example, the detachment of the packaging region 25 from the top coating region 312.

From what has been described and illustrated previously, the advantages that the present solution affords emerge clearly.

In particular, the present lead frame represents a cost-effective solution which allows to reduce the occurrence, in packaged integrated electronic devices, of the delamination between the molded packaging region and the metallic coating regions of the lead frame.

In conclusion, it is clear that modifications and variations may be made to what has been described and illustrated so far, without thereby departing from the scope of the present invention, as defined in the annexed claims.

For example, the lead frame may have a shape different from the ones previously shown.

The invention claimed is:

1. An integrated electronic device, comprising:
  a lead frame comprising:
    a die pad made of a first metallic material and including a top surface; and
    a top coating layer made of a second metallic material and arranged in contact with the top surface, wherein the second metallic material has an oxidation rate lower than an oxidation rate of the first metallic material;
    wherein corner portions of the top surface of the die pad are not covered by said top coating layer;
  an oxidized region coating said corner portions and being laterally in contact with the top coating layer;
  an integrated circuit die supported by the die pad; and a dielectric packaging region which covers, in direct contact, the die, the oxidized regions and the top coating layer adjacent to the oxidized regions.

2. The integrated electronic device according to claim 1, wherein each corner portion has a squared shape.

3. The integrated electronic device according to claim 1, further comprising a plurality of pads having top surfaces coated by coating regions made of the second metallic material.

4. An integrated electronic device, comprising:
a lead frame comprising:
a die pad made of a first metallic material and including a top surface;
a ground ring laterally surrounding the die pad and including a top surface, wherein the ground ring has a shape of a squared frame;
a top coating layer made of a second metallic material and arranged in contact with the top surface, wherein the second metallic material has an oxidation rate lower than an oxidation rate of the first metallic material; and
an additional top coating layer made of the second metallic material and arranged in contact with the top surface of the ground ring;
wherein corner portions of the top surface of the die pad are not covered by said top coating layer; and
wherein corner portions of the top surface of the ground ring are not covered by said additional top coating layer; and
an oxidized region coating said corner portions and being laterally in contact with the top coating layer;
wherein said oxidized region coats each corner portion of the ground ring;
an integrated circuit die supported by the die pad; and
a dielectric packaging region which covers, in direct contact, the die, the oxidized regions and the top coating layer adjacent to the oxidized regions.

5. The integrated electronic device according to claim 4, wherein each corner portion has a squared shape.

6. The integrated electronic device according to claim 4, further comprising a plurality of pads having top surfaces coated by coating regions made of the second metallic material.

7. An integrated electronic device according to claim 1, further comprising:
a lead frame comprising:
a die pad made of a first metallic material and including a top surface;
an inner frame which laterally surrounds the die pad;
an outer frame which laterally surrounds the inner frame;
a plurality of tie bars interposed between the outer frame and the inner frame;
a top coating layer made of a second metallic material and arranged in contact with the top surface, wherein the second metallic material has an oxidation rate lower than an oxidation rate of the first metallic material; and
a further top coating layer made of the second metallic material and arranged in contact with top surfaces of the inner frame and outer frame;
wherein portions of the inner frame at locations where the inner frame is connected with the tie bars are not covered by said further top coating layer;
an oxidized region coating said corner portions and being laterally in contact with the top coating layer; and wherein said oxidized region coats the portions of the inner frame;
an integrated circuit die supported by the die pad; and
a dielectric packaging region which covers, in direct contact, the die, the oxidized regions and the top coating layer adjacent to the oxidized regions.

8. The integrated electronic device according to claim 7, wherein the further top coating layer does not cover top surfaces of the tie bars and wherein said oxidized region coats top surfaces of the tie bars.

9. The integrated electronic device according to claim 7, wherein the inner frame and the outer frame have different heights, and wherein each tie bar includes a corresponding slanted portion to transition between said different heights.

10. The integrated electronic device according to claim 7, wherein each corner portion has a squared shape.

11. The integrated electronic device according to claim 7, further comprising a plurality of pads having top surfaces coated by coating regions made of the second metallic material.

12. An integrated electronic device, comprising:
a lead frame, comprising:
a die pad structure made of a first metallic material, said die pad structure including a die pad having a top structure surface; and
a top coating structure formed by a second metallic material having an oxidation rate lower than an oxidation rate of the first material, said top coating structure arranged, in direct contact, on the top structure surface;
wherein the top coating structure covers the top structure surface, leaving exposed a number of corner portions of the top structure surface, which are separate from one another; and
wherein the die pad structure forms a number of edges; and
wherein each edge is perpendicular to a corresponding corner portion with which it is in direct contact;
an oxidized region coating said corner portions and being laterally in contact with the top coating structure;
an integrated circuit die supported by the die pad; and
a dielectric packaging region which covers, in direct contact, the die, the oxidized regions and the top coating structure adjacent to the oxidized regions.

13. The integrated electronic device according to claim 12, wherein the top coating structure includes a top coating region covering the die pad; and wherein said corner portions are formed by the die pad, which has a squared shape.

14. The integrated electronic device according to claim 13, wherein the die pad structure further includes a ground ring laterally surrounding the die pad and having the shape of a squared frame; and wherein the top coating structure includes an additional top coating layer covering the ground ring; and wherein said corner portions are formed by the ground ring.

15. The integrated electronic device according to claim 13, further including:
a main body; and
a plurality of pads, which form a single piece with the die pad and the main body, the die pad and the pads extending from the main body, the pads being laterally staggered with respect to the die pad;
wherein the plurality of pads are coated at top by corresponding top coating regions made of the second metallic material.

* * * * *